United States Patent
Chou et al.

(10) Patent No.: US 7,507,676 B2
(45) Date of Patent: Mar. 24, 2009

(54) FILM FORMATION METHOD AND APPARATUS FOR SEMICONDUCTOR PROCESS

(75) Inventors: Pao-Hwa Chou, Kai (JP); Kazuhide Hasebe, Minami-alps (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 11/623,483

(22) Filed: Jan. 16, 2007

(65) Prior Publication Data

US 2007/0167028 A1    Jul. 19, 2007

(30) Foreign Application Priority Data

Jan. 16, 2006    (JP) ............................. 2006-007951

(51) Int. Cl.
*H01L 21/31*    (2006.01)
*H01L 21/469*    (2006.01)

(52) U.S. Cl. ..................... 438/758; 438/769; 438/770; 257/E21.268; 257/E21.393

(58) Field of Classification Search ................ 438/770, 438/778, 779, 791, 792–794

See application file for complete search history.

(56) References Cited

U.S. PATENT DOCUMENTS

2003/0224618 A1    12/2003    Sato et al.
2005/0095770 A1*    5/2005    Kumagai et al. ............ 438/202

FOREIGN PATENT DOCUMENTS

JP    6-45256    2/1994
JP    11-87341    3/1999

* cited by examiner

*Primary Examiner*—W. David Coleman
*Assistant Examiner*—Shaka Scarlett
(74) *Attorney, Agent, or Firm*—Oblon, Spivak, McClelland, Maier & Neustadt, P.C.

(57) ABSTRACT

An insulating film is formed on a target substrate by CVD, in a process field to be selectively supplied with a first process gas containing a silane family gas, a second process gas containing a nitriding gas, and a third process gas containing a carbon hydride gas. This method includes repeatedly performing supply of the first process gas to the process field, supply of the second process gas to the process field, and supply of the third process gas to the process field. The supply of the third process gas includes an excitation period of supplying the third process gas to the process field while exciting the third process gas by an exciting mechanism.

10 Claims, 19 Drawing Sheets

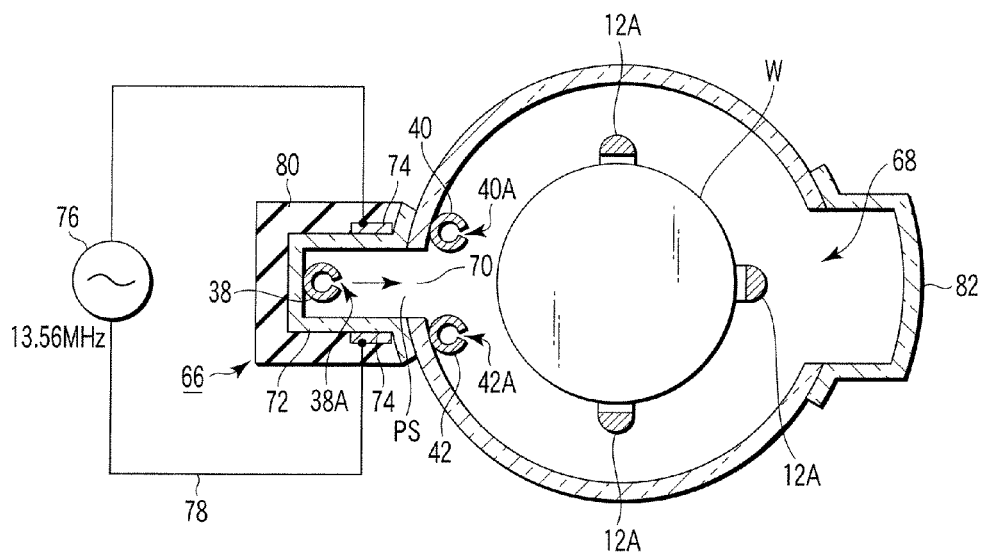
F I G. 2
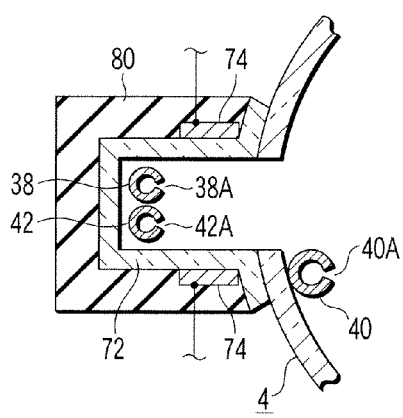
F I G. 3

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Application No. 2006-007951, filed Jan. 16, 2006, the entire contents of which are incorporated herein by reference.

BACKGROUND OF THE INVENTION

1. Field of the Invention

The present invention relates to a film formation method and apparatus for a semiconductor process for forming an insulating film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. US 2003/0224618 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rates, process pressures, and process temperatures, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), SOG (Spin On Glass), and $Si_3N_4$ (silicon nitride). Particularly, silicon nitride films are widely used, because they have better insulation properties as compared to silicon oxide films, and they can sufficiently serve as etching stopper films or inter-level insulating films.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachloro-disilane (HCD: $Si_2Cl_6$), or bistertialbutylaminosilane (BTBAS: $SiH_2(NH(C_4H_9)_2)$, is used as a silicon source gas. For example, a silicon nitride film is formed by thermal CVD using a gas combination of $SiH_2Cl_2+NH_3$ (see Jpn. Pat. Appln. KOKAI Publication No. 11-87341) or $Si_2Cl_6+NH_3$.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 6-45256 and No. 11-87341). In general, this film formation method is called ALD (Atomic layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

When an insulating film as one of those described above is formed and then another thin film is formed thereon, contaminants such as organic substances and particles may have stuck to the surface of the insulating film. Accordingly, a cleaning process is performed to remove the contaminants, as needed. In this cleaning process, the semiconductor wafer is immersed in a cleaning solution, such as diluted hydrofluoric acid, to perform etching on the surface of the insulating film. Consequently, the surface of the insulating film is etched by a very small amount, thereby removing the contaminants.

Where such an insulating film is formed by CVD at a higher process temperature of, e.g., about 760° C., the etching rate of the insulating film during the cleaning process is very small. Accordingly, the insulating film is not excessively etched by cleaning, and thus the cleaning process is performed with high controllability in the film thickness. However, where a thin film having a low heat resistance is present as an underlayer, a thermal CVD process at high temperature is unsuitable.

On the other hand, where such an insulating film is formed by ALD film formation at a lower process temperature of, e.g., about 400° C., the etching rate of the insulating film during the cleaning process is relatively large. Accordingly, the insulating film may be excessively etched by cleaning, and thus the cleaning process entails lower controllability in the film thickness.

Further, a silicon nitride film may be used as an etching stopper film or inter-level insulating film. In this case, the etching rate of the silicon nitride film must be very low. However, the conventional film formation method cannot satisfy this requirement.

BRIEF SUMMARY OF THE INVENTION

An object of the present invention is to provide a method and apparatus for forming an insulating film, which can employ a relatively low process temperature in film formation, and cause the etching rate of the film to be lower during a cleaning process, so that the cleaning process can be performed with high controllability in the film thickness, while allowing the film to sufficiently serve as an etching stopper film or inter-level insulating film. It should be noted that the present invention is a modification of the invention disclosed in Jpn. Pat. Appln. KOKAI Publication No. 2003-282566 (Oct. 3, 2003) and US 2006/0205231 A1 (Sep. 14, 2006).

According to a first aspect of the present invention, there is provided a film formation method for a semiconductor process for forming an insulating film on a target substrate by CVD, in a process field configured to be selectively supplied with a first process gas containing a silane family gas, a second process gas containing a nitriding gas, and a third process gas containing a carbon hydride gas, the method comprising repeatedly performing:

supply of the first process gas to the process field;
supply of the second process gas to the process field; and
supply of the third process gas to the process field,
wherein the supply of the third process gas comprises an excitation period of supplying the third process gas to the process field while exciting the third process gas by an exciting mechanism.

The method according to the first aspect may alternately comprise:

a first step of performing supply of the first process gas to the process field;
a second step of stopping supply of the first, second, and third process gases to the process field;
a third step of performing supply of the third process gas to the process field while stopping supply of the first and second process gases to the process field, the third step comprising the excitation period;
a fourth step of stopping supply of the first, second, and third process gases to the process field;
a fifth step of performing supply of the second process gas to the process field while stopping supply of the first and third process gases to the process field; and
a sixth step of stopping supply of the first, second, and third process gases to the process field.

Alternatively, the method according to the first aspect may alternately comprise:

a first step of performing supply of the first and second process gases to the process field while stopping supply of the third process gas to the process field;
a second step of stopping supply of the first, second, and third process gases to the process field;
a third step of performing supply of the third process gas to the process field while stopping supply of the first and second process gases to the process field, the third step comprising the excitation period; and
a fourth step of stopping supply of the first, second, and third process gases to the process field.

Alternatively, the method according to the first aspect may alternately comprise:

a first step of performing supply of the first gas to the process field;
a second step of stopping supply of the first, second, and third process gases to the process field;
a third step of performing supply of the second and third process gases to the process field while stopping supply of the first process gas to the process field, the third step comprising the excitation period; and
a fourth step of stopping supply of the first, second, and third process gases to the process field.

Alternatively, the method according to the first aspect may alternately comprise:

a first step of performing supply of the first process gas to the process field;
a second step of stopping supply of the first, second, and third process gases to the process field;
a third step of performing supply of the third process gas to the process field while stopping supply of the first and second process gases to the process field, the third step comprising the excitation period;
a fourth step of performing supply of the second process gas to the process field while stopping supply of the first and third process gases to the process field, the fourth step comprising an activation period of supplying the second process gas to the process field while exciting the second process gas by an activating mechanism; and
a fifth step of stopping supply of the first, second, and third process gases to the process field.

According to a second aspect of the present invention, there is provided a film formation apparatus for a semiconductor process, comprising:

a process container having a process field configured to accommodate a target substrate;
a support member configured to support the target substrate inside the process field;
a heater configured to heat the target substrate inside the process field;
an exhaust system configured to exhaust gas inside the process field;
a first process gas supply circuit configured to supply a first process gas containing a silane family gas to the process field;
a second process gas supply circuit configured to supply a second process gas containing a nitriding gas to the process field;
a third process gas supply circuit configured to supply a third process gas containing a carbon hydride gas to the process field; and
a control section configured to control an operation of the apparatus,
wherein, in order to form an insulating film on the target substrate by CVD, the control section repeatedly executes:
supply of the first process gas to the process field;
supply of the second process gas to the process field; and
supply of the third process gas to the process field,
wherein the supply of the third process gas comprises an excitation period of supplying the third process gas to the process field while exciting the third process gas by an exciting mechanism.

According to a third aspect of the present invention, there is provided a computer readable medium containing program instructions for execution on a processor, which is used for a film formation apparatus for a semiconductor process for forming an insulating film on a target substrate by CVD, in a process field configured to be selectively supplied with a first process gas containing a silane family gas, a second process gas containing a nitriding gas, and a third process gas containing a carbon hydride gas, wherein the program instructions, when executed by the processor, cause the film formation apparatus to repeatedly execute:

supply of the first process gas to the process field;
supply of the second process gas to the process field; and
supply of the third process gas to the process field,
wherein the supply of the third process gas comprises an excitation period of supplying the third process gas to the process field while exciting the third process gas by an exciting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a sectional plan view showing part of the apparatus shown in FIG. 1;

FIG. 3 is a sectional plan view showing part of a modification of the apparatus shown in FIG. 1;

DETAILED DESCRIPTION OF THE INVENTION

Figure 1:
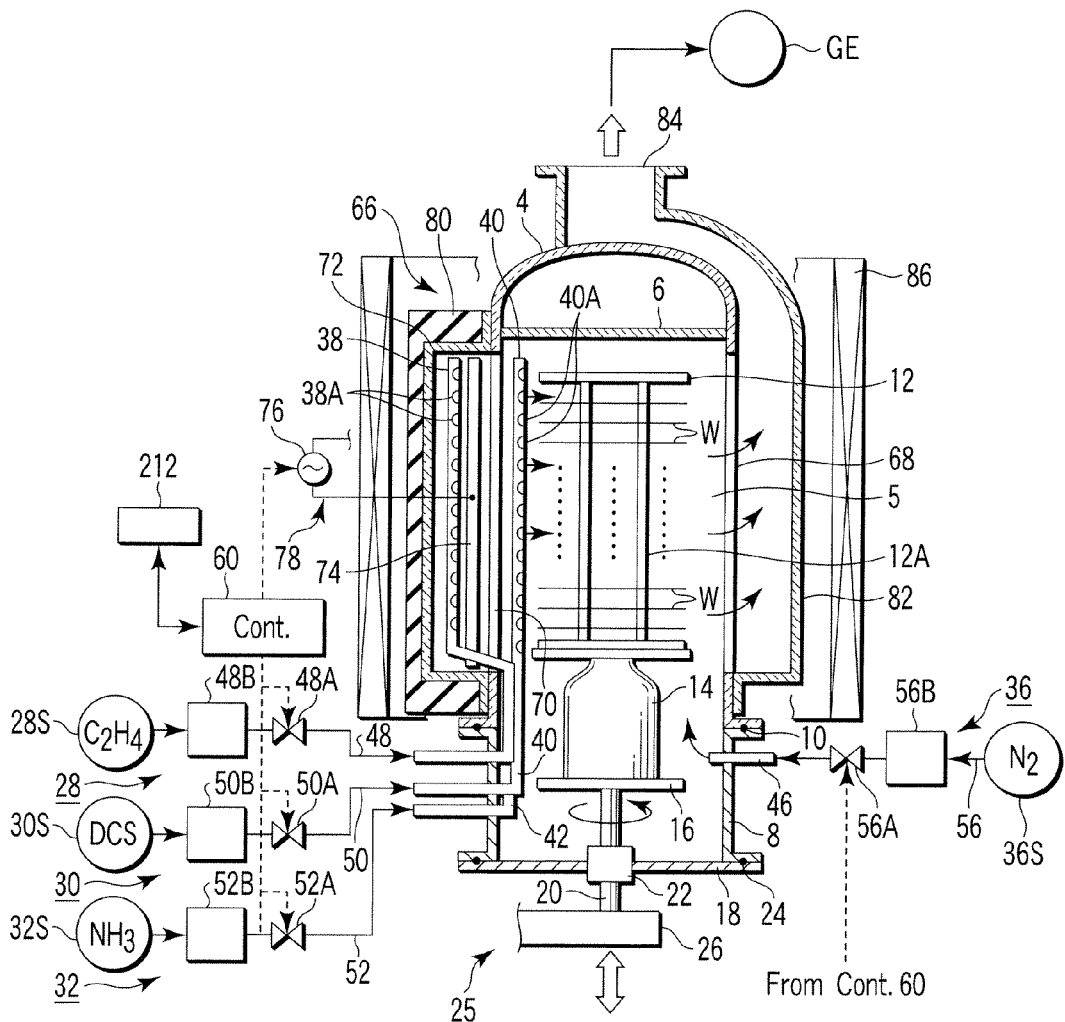
FIG. 1 is a sectional front view showing a film formation apparatus (vertical CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional front view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a third process gas containing $C_2H_4$ gas (ethylene gas) as a carbon hydride gas. The film formation apparatus 2 is configured to form an SiCN film, which is an insulating film containing carbon, on target substrates by CVD in the process field, while activating the ethylene gas by means of plasma. It should be noted that the ammonia gas may be also activated, as needed.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a first process gas supply circuit 30, a second process gas supply circuit 32, a third process gas supply circuit 28, and a purge gas supply circuit 36. The first process gas supply circuit 30 is arranged to supply a first process gas containing a silane family gas, such as DCS (dichlorosilane) gas. The second process gas supply circuit 32 is arranged to supply a second process gas containing a nitriding gas, such as ammonia ($NH_3$) gas. The third process gas supply circuit 28 is arranged to supply a third process gas containing a carbon hydride gas, such as $C_2H_4$ gas (ethylene gas). The purge gas supply circuit 36 is arranged to supply an inactive gas, such as $N_2$ gas, as a purge gas. Each of the first to third process gases is mixed with a suitable amount of carrier gas, as needed. However, such a carrier gas will not be mentioned, hereinafter, for the sake of simplicity of explanation.

More specifically, the third, first, and second process gas supply circuits 28, 30, and 32 include gas distribution nozzles 38, 40, and 42, respectively, each of which is formed of a quartz pipe which penetrates the sidewall of the manifold 8 from the outside and then turns and extends upward (see FIG. 1). The gas distribution nozzles 38, 40, and 42 respectively have a plurality of gas spouting holes 38A, 40A, and 42A, each set of holes being formed at predetermined intervals in the longitudinal direction (the vertical direction) over all the wafers W on the wafer boat 12. Each of the gas spouting holes 38A, 40A, and 42A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, 42, and 46 are connected to gas sources 28S, 30S, 32S, and 36S of $C_2H_4$ gas, DCS gas, $NH_3$ gas, and $N_2$ gas, respectively, through gas supply lines (gas passages) 48, 50, 52, and 56, respectively. The gas supply lines 48, 50, 52, and 56 are provided with switching valves 48A, 50A, 52A, and 56A and flow rate controllers 48B, 50B, 52B, and 56B, such as mass flow controllers, respectively. With this arrangement, $C_2H_4$ gas, DCS gas, $NH_3$ gas, and $N_2$ gas can be supplied at controlled flow rates.

A gas exciting section (activating section) 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertical long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the third process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The third process gas containing $C_2H_4$ gas is spouted from the gas spouting holes 38A of the gas distribution nozzle 38 toward the plasma generation area PS. Then, the third process gas is excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At positions near and outside the opening 70 of the gas exciting section 66, the gas distribution nozzles 40 and 42 of the first and second process gases are disposed. Specifically, the gas distribution nozzle 40 extends upward on one side of the outside of the opening 70 (in the process container 4), and the gas distribution nozzle 42 extends upward on the other side opposite to the gas distribution nozzle 40. The first process gas containing DCS gas and the second process gas containing NH₃ gas are spouted from the gas spouting holes 40A and 42A of the gas distribution nozzles 40 and 42, respectively, toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control the film formation process described below in accordance with the process recipe of the film formation process concerning, e.g., the film thickness and composition of a film to be formed, stored in the memory 212 thereof in advance. In the memory 212, the relationship between the process gas flow rates and the thickness and composition of the film is also stored as control data in advance. Accordingly, the main control section 60 can control the elevating mechanism 25, gas supply circuits 28, 30, 32, and 36, exhaust system GE, gas exciting section 66, heater 86, and so forth, based on the stored process recipe and control data.

FIG. 3 is a sectional plan view showing part of a modification of the apparatus shown in FIG. 1. The present invention includes not only a process utilizing activation of the third process gas containing a carbon hydride gas, such as $C_2H_4$ gas, but also a process utilizing activation of the second process gas containing a nitriding gas, such as $NH_3$ gas, while using the structure shown in FIG. 3. For this purpose, the modification shown in FIG. 3 is arranged such that the gas distribution nozzle 42' of the second process gas is located adjacent to the gas distribution nozzle 38 of the third process gas. Specifically, the gas distribution nozzle 42' of the second process gas is bent outward in the radial direction of the process container 4, at a position lower than the lowermost wafer W on the wafer boat 12. Then, the gas distribution nozzle 42' vertically extends at the deepest position (the farthest position from the center of the process container 4) in the gas exciting section 66. As shown also in FIG. 3, the gas distribution nozzle 42' is separated outward from an area sandwiched between the pair of electrodes 74 (a position where the RF electric field is most intense), i.e., the plasma generation area PS where the main plasma is actually generated. The second process gas containing $NH_3$ gas is spouted from the gas spouting holes 42A of the gas distribution nozzle 42' toward the plasma generation area PS. Then, the second process gas is excited (decomposed or activated) in the plasma generation area PS, and is supplied in this state onto the wafers W on the wafer boat 12.

Next, an explanation will be given of a film formation method (so called ALD (Atomic Layer Deposition) film formation) performed in the apparatus shown in FIG. 1.

First Embodiment

In the film formation method according to a first embodiment, an insulating film of SiCN (silicon carbon nitride) is formed on semiconductor wafers by CVD. In order to achieve this, a first process gas containing dichlorosilane (DCS) gas as a silane family gas, a second process gas containing ammonia ($NH_3$) gas as a nitriding gas, and a third process gas containing $C_2H_4$ gas (ethylene gas) as a carbon hydride gas are selectively supplied into the process field 5 accommodating wafers W.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases are intermittently supplied from the respective gas distribution nozzles 40, 42, and 38 at controlled flow rates.

Specifically, the first process gas containing DCS gas is supplied from the gas spouting holes 40A of the gas distribution nozzle 40 to form gas flows parallel with the wafers W on the wafer boat 12. While being supplied, molecules of DCS gas and molecules and atoms of decomposition products generated by its decomposition are adsorbed on the wafers W. The second process gas containing $NH_3$ gas is supplied from the gas spouting holes 42A of the gas distribution nozzle 42 to form gas flows parallel with the wafers W on the wafer boat 12. While being supplied, molecules of $NH_3$ gas and molecules and atoms of decomposition products generated by its decomposition react with molecules of DCS gas and so forth adsorbed on the surface of the wafers W, so that a unit layer of silicon nitride is formed on the wafers W. Alternatively, when DCS gas flows onto the surface of the wafers W, on which substances derived from $NH_3$ gas are adsorbed, the same reaction is caused, so a unit layer of silicon nitride is formed on the wafers W.

On the other hand, the third process gas containing $C_2H_4$ gas is supplied from the gas spouting holes 38A of the gas distribution nozzle 38 to form gas flows parallel with the wafers W on the wafer boat 12. The third process gas is selectively excited and partly turned into plasma when it passes through the plasma generation area PS between the pair of electrodes 74. At this time, the $C_2H_4$ gas is activated and thereby provides radicals of carbon and so forth, which then flow out from the opening 70 of the gas exciting section 66 toward the center of the process container 4, and are supplied into gaps between the wafers W in a laminar flow state. At this time, carbon components are taken into the unit layer of silicon nitride, so a unit layer of carbon-containing silicon nitride (SiCN) is formed.

The process for forming this unit layer is repeated, so that thin unit layers formed by respective cycles are laminated to from a carbon-containing silicon nitride film having a target thickness. Since the third process gas is turned into plasma, the reaction (decomposition) of $C_2H_4$ gas is promoted and thus a lot of radicals of, e.g., carbon are produced. Consequently, the number of carbon components introduced into a silicon nitride film can be increased.

Figure 4:
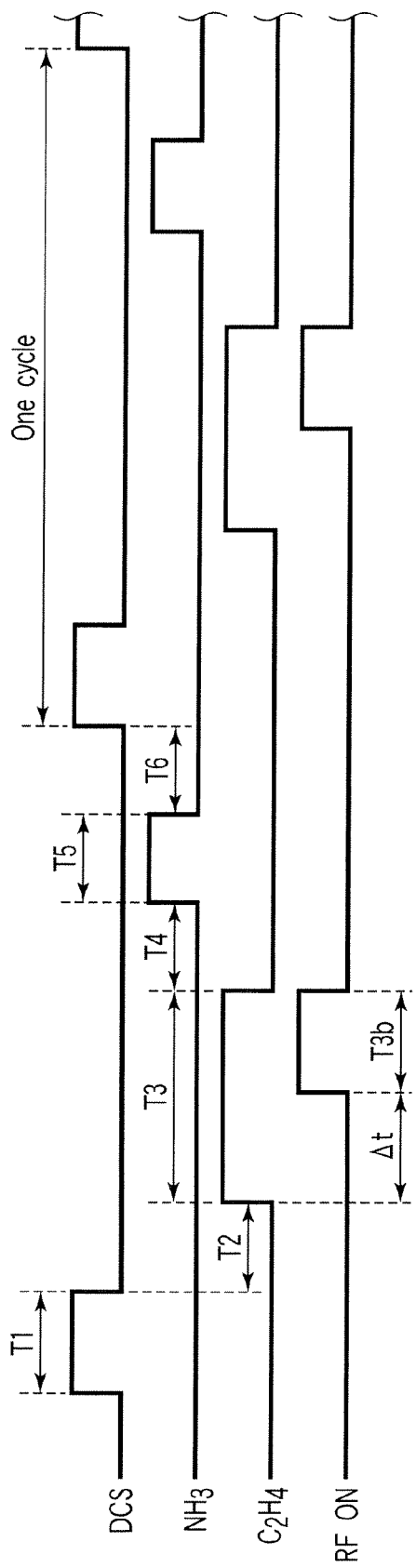
FIG. 4 is a timing chart of the gas supply and RF (radio frequency) application of a film formation method according to a first embodiment of the present invention.

FIG. 4 is a timing chart of the gas supply and RF (radio frequency) application of a film formation method according to the first embodiment of the present invention. As shown in FIG. 4, the film formation method according to this embodiment is arranged to alternately repeat first to sixth steps T1 to T6. A cycle comprising the first to sixth steps T1 to T6 is repeated a number of times, and thin films (unit layers) of SiCN formed by respective cycles are laminated, thereby arriving at an SiCN film having a target thickness.

Specifically, the first step T1 is arranged to perform supply of the first process gas (denoted as DCS in FIG. 4) to the process field 5, while stopping supply of the second process gas (denoted as $NH_3$ in FIG. 4) and the third process gas (denoted as $C_2H_4$ in FIG. 4) to the process field 5. The second step T2 is arranged to stop supply of the first, second, and third process gases to the process field 5. The third step T3 is arranged to perform supply of the third process gas to the process field 5, while stopping supply of the first and second process gases to the process field 5. Further, halfway through the third step T3, the RF power supply 76 is set in the ON state to turn the third process gas into plasma by the gas exciting section 66, so as to supply the third process gas in an activated state to the process field 5 during a sub-step T3b. The fourth step T4 is arranged to stop supply of the first, second, and third process gases to the process field 5. The fifth step T5 is arranged to perform supply of the second process gas to the process field 5, while stopping supply of the first and third process gases to the process field 5. The sixth step T6 is arranged to stop supply of the first, second, and third process gases to the process field 5.

In the third step T3, the RF power supply 76 is turned on after a predetermined time Δt passes, to turn the third process gas into plasma by the gas exciting section 66, so as to supply $C_2H_4$ gas in an activated state to the process field 5 during the sub-step T3b. The predetermined time Δt is defined as a pre-flow time necessary for stabilizing the flow rate of the third process gas, which is set at, e.g., about 5 seconds. However, the third process gas may be turned into plasma by the gas exciting section 66 over the entire period of supplying the third process gas. Since the RF power supply is turned on to generate plasma after the flow rate of the third process gas is stabilized, the uniformity of radical concentration among the wafers W (uniformity in the vertical direction) is improved.

Where the structure shown in FIG. 3 is used, the fifth step T5 may be arranged to turn the second process gas in to plasma by the gas exciting section 66, so as to supply $NH_3$ gas in an activated state to the process field 5. In this case, however, radicals of $NH_3$ gas become rich, and may beat out carbon components adhered or deposited on the surface of the wafers, thereby decreasing the carbon content of a film to be formed. Accordingly, the fifth step T5 is preferably arranged not to turn the second process gas into plasma.

Each of the second, fourth, and sixth steps T2, T4, and T6 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the second, fourth, and sixth steps T2, T4, and T6 may be arranged such that the first half utilizes only vacuum-exhaust and the second half utilizes both vacuum-exhaust and inactive gas supply. Further, the first, third, and fifth steps T1, T3, and T5 may be arranged to stop vacuum-exhausting the process container 4 while supplying each of the first to third process gases. However, where supplying each of the first to third process gases is performed along with vacuum-exhausting the process container 4, the interior of the process container 4 can be continuously vacuum-exhausted over the entirety of the first to sixth steps T1 to T6.

In FIG. 4, the first step T1 is set to be within a range of about 0.5 to 10 seconds, and, for example, at about 4 seconds. The second step T2 is set to be within a range of about 0.5 to 10 seconds, and, for example, at about 5 seconds. The third step T3 is set to be within a range of about 1.5 to 20 seconds, and, for example, at about 6 seconds. The sub-step T3b is set to be within a range of about 1 to 7 seconds, and, for example, at about 5 seconds. The fourth step T4 is set to be within a range of about 0.5 to 10 seconds, and, for example, at about 5 seconds. The fifth step T5 is set to be within a range of about 0.5 to 50 seconds, and, for example, at about 30 seconds. The sixth step T6 is set to be within a range of about 0.5 to 10 seconds, and, for example, at about 5 seconds. In general, the film thickness obtained by one cycle of the first to sixth steps T1 to T6 is about 0.048 to 0.13 nm. Accordingly, for example, where the target film thickness is 70 nm, the cycle is repeated about 600 times. However, these values of time and thickness are merely examples and thus are not limiting.

As described above, the step T1 of supplying the first process gas containing DCS gas, the step T3 of supplying the third process gas containing $C_2H_4$ gas and including a period of exciting the gas by plasma, and the step T5 of supplying the second process gas containing $NH_3$ gas are alternately performed with the purge steps T2, T4, and T6 respectively interposed therebetween. This makes it possible to greatly decrease the dielectric constant of an SiCN film to be formed, and to greatly improve the etching resistance of the film in dry etching. This is thought to be caused due to the following reason.

Specifically, where the third process gas is turned into plasma, the reaction (decomposition) of $C_2H_4$ gas is promoted and thus a lot of carbon radicals are produced. Consequently, even where the film formation process is performed at a low temperature, a large number of Si—C bonds can be formed in the silicon nitride film. With an increase in the number of Si—C bonds thus formed in the film, the etching resistance of the film is remarkably improved. More specifically, even where the film formation temperature is set at, e.g., 550° C., which is lower than the conventional film formation temperature of, e.g., about 760° C., it is possible to decrease the etching rate of the film relative to diluted hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film.

In addition, the fifth step T5 close to the end of each cycle is arranged to perform supply of the second process gas containing $NH_3$ gas, which assists adsorption of DCS gas onto the wafers W in the first step T1 of the next cycle. Consequently, the number of Si—H bonds decreases while the number of Si—N bonds, which have a high etching resistance, increases, in the film.

Furthermore, as described above, the second, fourth, and sixth steps T2, T4, and T6, which stop supply of the process gases between the first, third, and fifth steps of performing supply of the process gases, serve as periods for reforming the film quality. The surface of an SiCN film, formed immediately before each of these periods, is reformed in this period, thereby improving the film quality. Consequently, the etching rate of the SiCN film is further decreased. The effect of the reformation process at an atomic level is thought to be as follows. Specifically, when an SiCN film containing carbon atoms is formed, some of the Cl atoms derived from DCS gas are not desorbed but bonded in an activated state to the uppermost surface of this thin film. During the steps T2, T4, and T6 of stopping supply of the process gases, C atoms and N atoms derived from $C_2H_4$ gas and $NH_3$ gas replace Cl atoms on the uppermost surface of the thin film, and reduce Cl components in the film, thereby decreasing the etching rate. Particularly, where $C_2H_4$ gas is used, the number of C atoms taken into the film is increased, thereby further decreasing the etching rate.

The process conditions of the film formation process are as follows. The flow rate of DCS gas is set to be within a range of 500 to 5,000 sccm, e.g., at 1,000 sccm (1 slm). The flow rate of $NH_3$ gas is set to be within a range of 100 to 10,000 sccm, e.g., at 1,000 sccm. The flow rate of $C_2H_4$ gas is set to be within a range of 100 to 2,000 sccm, e.g., at 500 sccm. The flow rate of $C_2H_4$ gas is set to be not more than three times the flow rate of DCS gas. This is so because, if the flow rate of $C_2H_4$ gas used as a carbon hydride gas is excessively high, the film quality is undesirably drastically lowered.

The process temperature is lower than ordinary CVD processes, and is set to be within a range of 300 to 700° C., and preferably a range of 550 to 650° C., e.g., at 630° C. If the process temperature is lower than 300° C., essentially no film is deposited because hardly any reaction is caused. If the process temperature is higher than 700° C., a low quality CVD film is deposited, and existing films, such as a metal film, suffer thermal damage.

The process pressure is set to be within a range of 13 Pa (0.1 Torr) to 1,330 Pa (10 Torr), and preferably a range of 40 Pa (0.3 Torr) to 266 Pa (2 Torr). For example, the process pressure is set at 1 Torr during the first step (adsorption step) T1 and the fifth step (nitridation step) T5, and at 0.3 Torr during the third step (step by use of plasma) T3. If the process pressure is lower than 13 Pa, the film formation rate becomes lower than the practical level. Where the process pressure does not exceed 1,330 Pa, the reaction mode on the wafers W is mainly of an adsorption reaction, and thus a high quality thin film can be stably deposited at a high film formation rate, thereby attaining a good result. However, if the process pressure exceeds 1,330 Pa, the reaction mode is shifted from the adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

<Modification 1 of First Embodiment>

Figure 5:
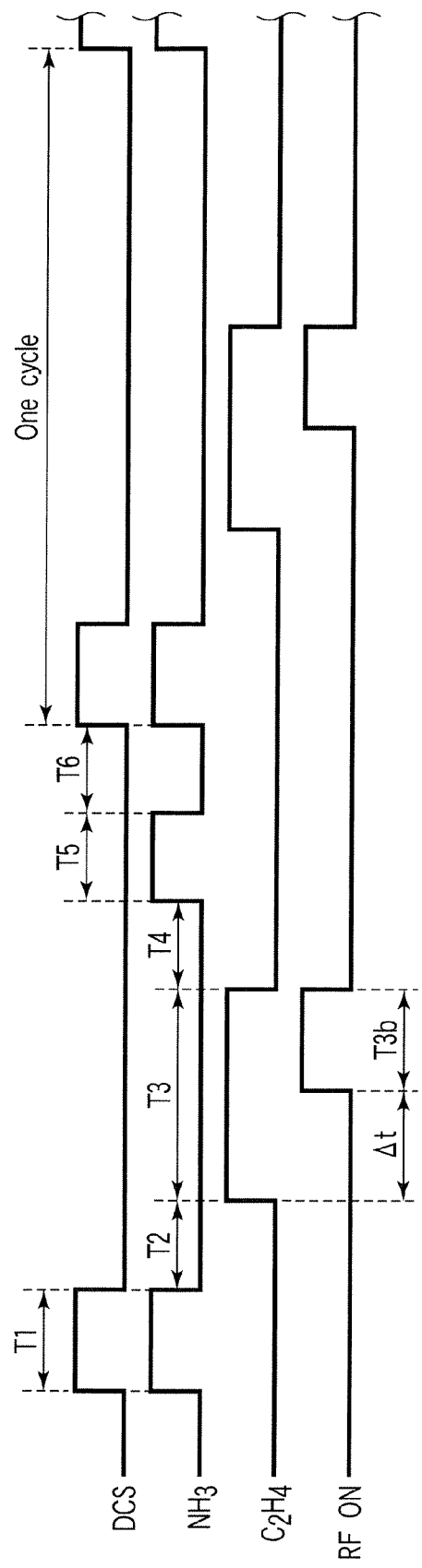
FIG. 5 is a timing chart of the gas supply and RF (radio frequency) application of a film formation method according to a modification 1 of the first embodiment of the present invention.

FIG. 5 is a timing chart of the gas supply and RF (radio frequency) application of a film formation method according to a modification 1 of the first embodiment of the present invention. As shown in FIG. 5, the modification 1 of the first embodiment is the same as the first embodiment except that the first step T1 is arranged to perform supply of the second process gas containing $NH_3$ gas in addition to the first process gas containing DCS gas.

The modification 1 of the first embodiment exhibits the same operation and effect as those of the first embodiment. Further, when DCS and $NH_3$ are supplied together, a CVD reaction is slightly caused and an SiN film rich in silicon is generated. In this case, when $C_2H_4$ is supplied in the next step, carbon atoms are easily adsorbed on nitrogen atoms of the SiN film. Consequently, the carbon content of an SiCN film finally obtained is increased. Further, since DCS is supplied along with $NH_3$, the film formation rate is increased.

The process conditions of this modification, such as gas flow rates, process pressures, and process temperatures, may be set basically the same as those of the first embodiment. However, the flow rate of DCS gas is preferably increased to be within a range of 5 to 10 times the flow rate of $NH_3$ gas. This is so because, if $NH_3$ gas is excessive, $NH_4Cl$ is easily generated as a by-product.

<Modification 2 of First Embodiment>

Figure 6:
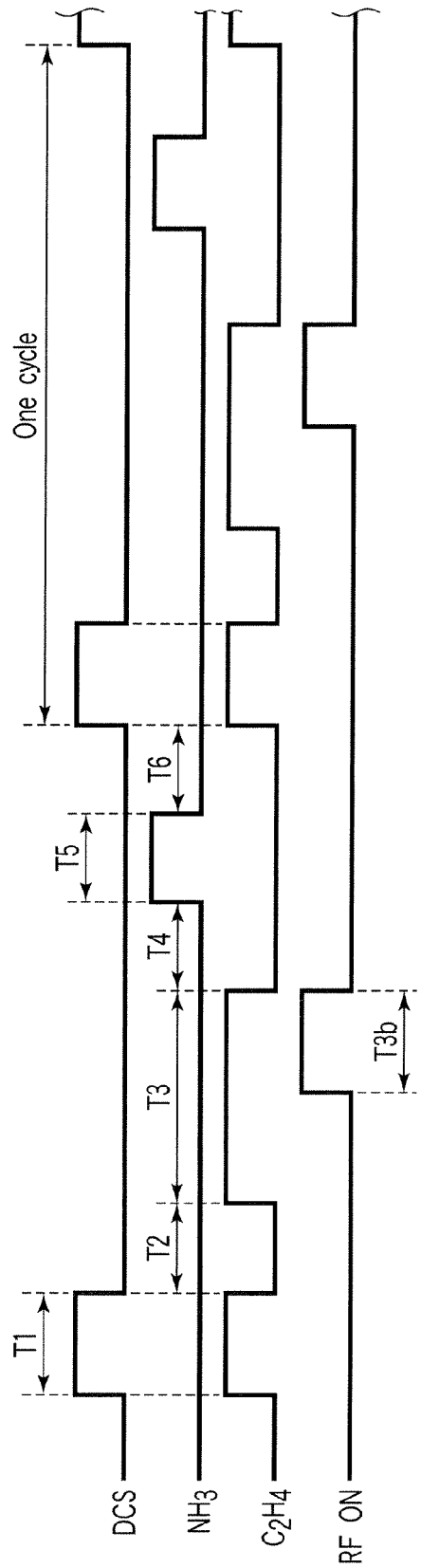
FIG. 6 is a timing chart of the gas supply and RF (radio frequency) application of a film formation method according to a modification 2 of the first embodiment of the present invention.

FIG. 6 is a timing chart of the gas supply and RF (radio frequency) application of a film formation method according to a modification 2 of the first embodiment of the present invention. As shown in FIG. 6, the modification 2 of the first embodiment is the same as the first embodiment except that the first step T1 is arranged to perform supply of the third process gas containing $C_2H_4$ gas in addition to the first process gas containing DCS gas.

The modification 2 of the first embodiment exhibits the same operation and effect as those of the first embodiment. Further, when DCS and $C_2H_4$ are supplied together, $C_2H_4$ is slightly adsorbed on the wafer surface. Consequently, the carbon content of an SiCN film finally obtained is increased. The process conditions of this modification, such as gas flow rates, process pressures, and process temperatures, may be set basically the same as those of the first embodiment.

<Modification 3 of First Embodiment>

Figure 7:
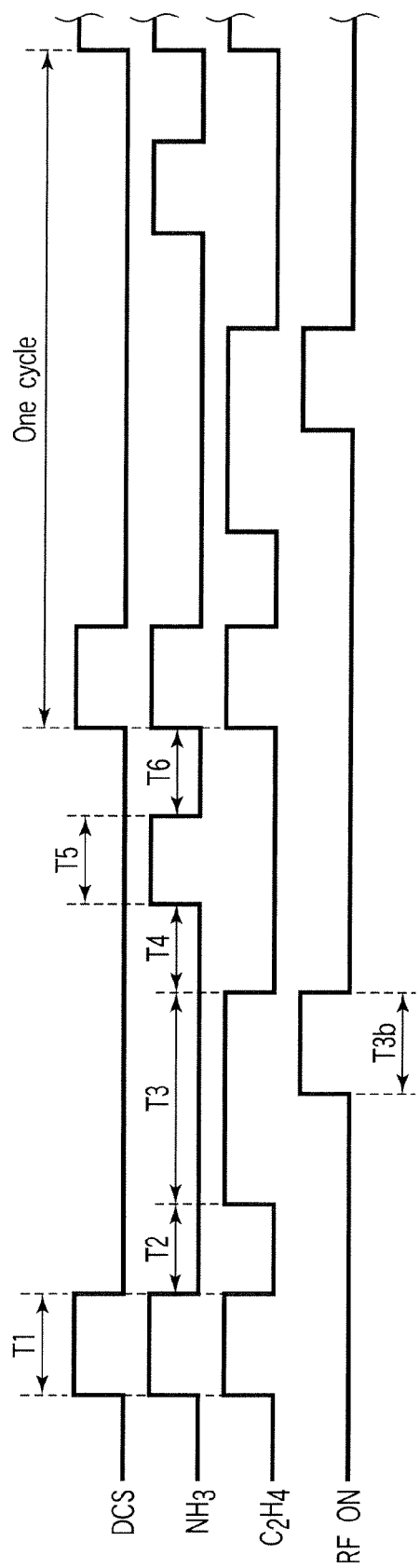
FIG. 7 is a timing chart of the gas supply and RF (radio frequency) application of a film formation method according to a modification 3 of the first embodiment of the present invention.

FIG. 7 is a timing chart of the gas supply and RF (radio frequency) application of a film formation method according to a modification 3 of the first embodiment of the present invention. As shown in FIG. 7, the modification 3 of the first embodiment is the same as the first embodiment except that the first step T1 is arranged to perform supply of the second process gas containing $NH_3$ gas and the third process gas containing $C_2H_4$ gas in addition to the first process gas containing DCS gas.

The modification 3 of the first embodiment exhibits the same operation and effect as those of the first embodiment. Further, the modification 3 of the first embodiment is expected to provide a synergistic effect of the modification 1 and modification 2 of the first embodiment. The process conditions of this modification, such as gas flow rates, process pressures, and process temperatures, may be set basically the same as those of the first embodiment. However, as described in the modification 1 of the first embodiment, the flow rate of DCS gas is preferably increased to be within a range of 5 to 10 times the flow rate of $NH_3$ gas.

Second Embodiment

Figure 8:
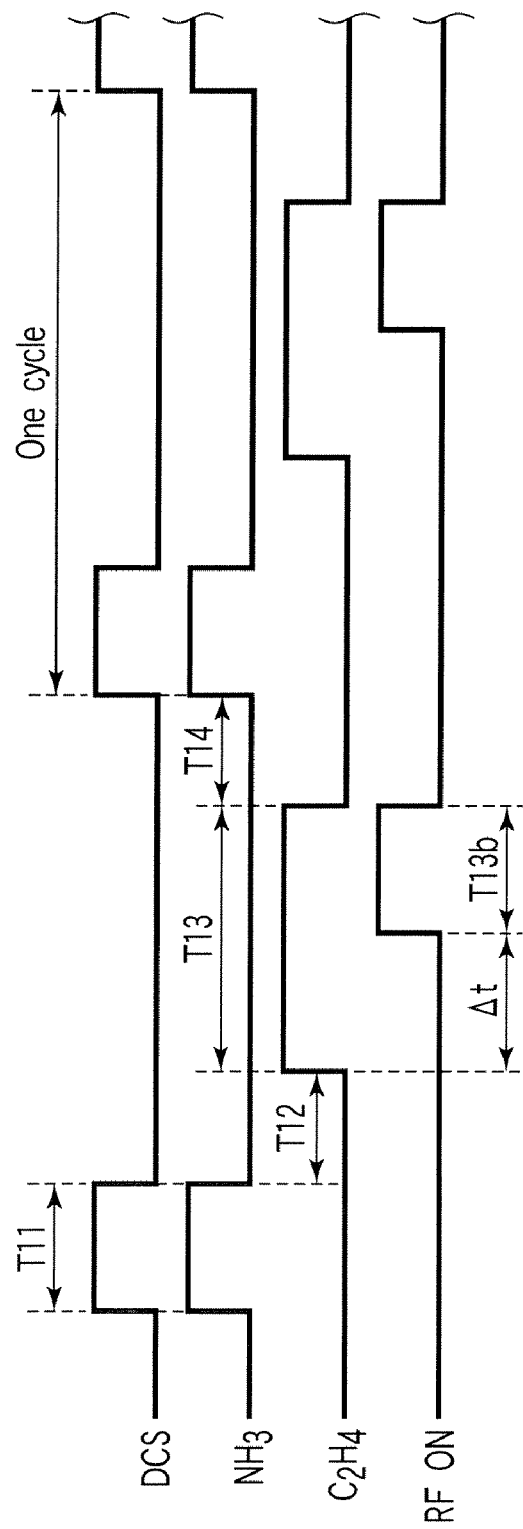
FIG. 8 is a timing chart of the gas supply and RF (radio frequency) application of a film formation method according to a second embodiment of the present invention.

FIG. 8 is a timing chart of the gas supply and RF (radio frequency) application of a film formation method according to the second embodiment of the present invention. As shown in FIG. 8, the film formation method according to this embodiment is arranged to alternately repeat first to fourth steps T11 to T14. A cycle comprising the first to fourth steps T11 to T14 is repeated a number of times, and thin films (unit layers) of SiCN formed by respective cycles are laminated, thereby arriving at an SiCN film having a target thickness.

Specifically, the first step T11 is arranged to perform supply of the first process gas (denoted as DCS in FIG. 8) and the second process gas (denoted as $NH_3$ in FIG. 8) to the process field 5, while stopping supply of the third process gas (denoted as $C_2H_4$ in FIG. 8) to the process field 5. The second step T12 is arranged to stop supply of the first, second, and third process gases to the process field 5. The third step T13 is arranged to perform supply of the third process gas to the process field 5, while stopping supply of the first and second process gases to the process field 5. Further, halfway through the third step T13, the RF power supply 76 is set in the ON state to turn the third process gas into plasma by the gas exciting section 66, so as to supply the third process gas in an activated state to the process field 5 during a sub-step T13b. The fourth step T14 is arranged to stop supply of the first, second, and third process gases to the process field 5.

In other words, the second embodiment corresponds to a form that is arranged to shorten each cycle of the modification 1 of the first embodiment (see FIG. 5) by omitting the fifth and sixth steps T5 and T6 thereof. The second embodiment exhibits the same operation and effect as those of the first embodiment. Further, since the steps T5 and T6 are omitted, the throughput can be improved by that much.

The process conditions of the second embodiment, such as gas flow rates, process pressures, and process temperatures, may be set basically the same as those of the first embodiment. However, the fifth and sixth steps T5 and T6 at the end of each cycle are omitted, and $NH_3$ gas is supplied together with DCS gas. In this case, the flow rate of $NH_3$ gas should be set higher than that of the first embodiment or the modification 1 thereof to enhance deposition of $NH_3$ gas on the wafer surface. Specifically, the flow rates of DCS gas and $NH_3$ gas are preferably set to be about one to one.

<Modification 1 of Second Embodiment>

Figure 9:
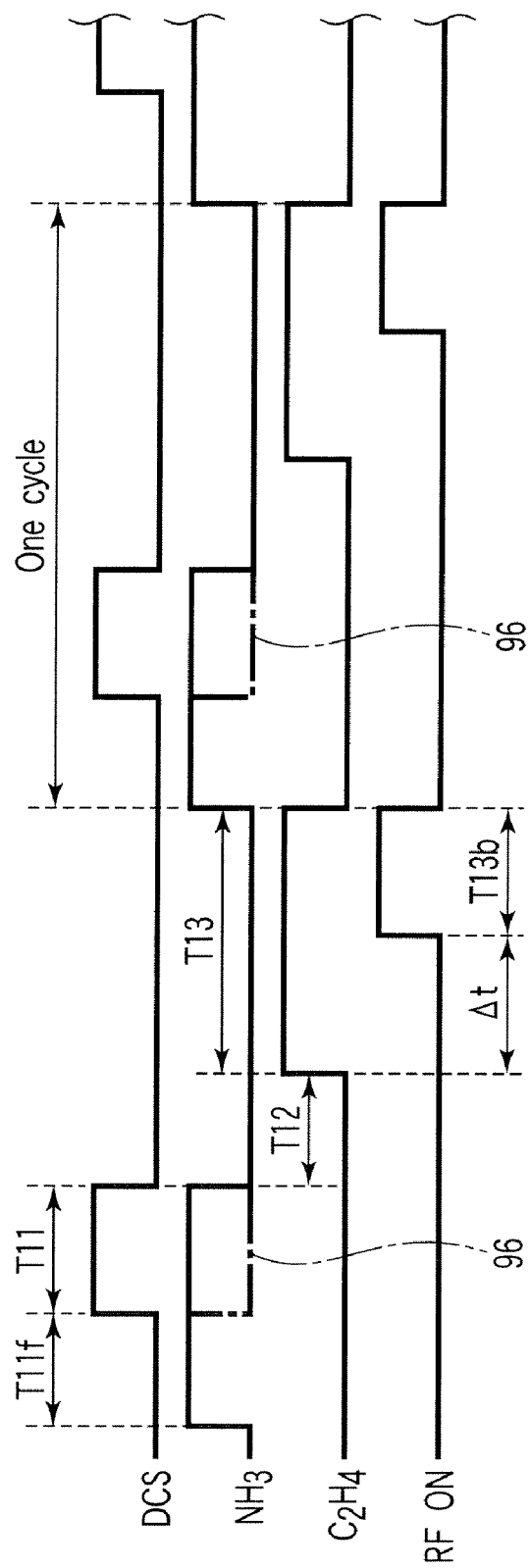
FIG. 9 is a timing chart of the gas supply and RF (radio frequency) application of a film formation method according to a modification 1 of the second embodiment of the present invention.

FIG. 9 is a timing chart of the gas supply and RF (radio frequency) application of a film formation method according to a modification 1 of the second embodiment of the present invention. As shown in FIG. 9, the modification 1 of the second embodiment is the same as the second embodiment except that the first step T11 is arranged to start supply of the second process gas containing $NH_3$ gas prior to supply of the first process gas containing DCS gas. In other words, the first step T11 includes a pre-flow period T11*f* of solely supplying the second process gas.

The modification 1 of the second embodiment exhibits the same operation and effect as those of the second embodiment. Further, in this case, since the second process gas is supplied for a longer time, nitrogen derived from $NH_3$ gas is adsorbed on the wafer surface in a larger amount, which assists adsorption of carbon components. The process conditions of the second embodiment, such as gas flow rates, process pressures, and process temperatures, may be set basically the same as those of the second embodiment. Further, in the modification 1 of the second embodiment, as indicated by a dashed line 96, the first step T11 may be arranged to perform supply of the second process gas containing $NH_3$ gas and supply of the first process gas containing DCS gas serially in this order.

Third Embodiment

Figure 10:
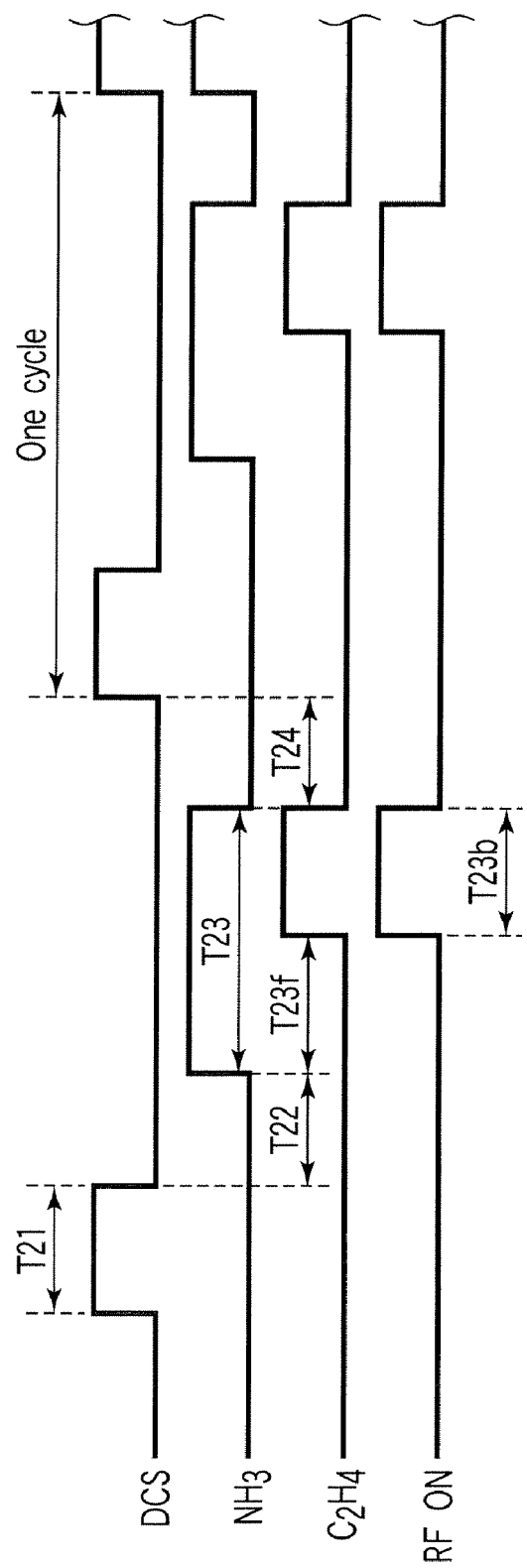
FIG. 10 is a timing chart of the gas supply and RF (radio frequency) application of a film formation method according to a third embodiment of the present invention.

FIG. 10 is a timing chart of the gas supply and RF (radio frequency) application of a film formation method according to the third embodiment of the present invention. As shown in FIG. 10, the film formation method according to this embodiment is arranged to alternately repeat first to fourth steps T21 to T24. A cycle comprising the first to fourth steps T21 to T24 is repeated a number of times, and thin films (unit layers) of SiCN formed by respective cycles are laminated, thereby arriving at an SiCN film having a target thickness.

Specifically, the first step T21 is arranged to perform supply of the first process gas (denoted as DCS in FIG. 10) to the process field 5, while stopping supply of the second process gas (denoted as $NH_3$ in FIG. 10) and the third process gas (denoted as $C_2H_4$ in FIG. 10) to the process field 5. The second step T22 is arranged to stop supply of the first, second, and third process gases to the process field 5. The third step T23 is arranged to perform supply of the second and third process gases to the process field 5, while stopping supply of the first process gas to the process field 5. In this case, the third step T23 is arranged to start supply of the second process gas prior to supply of the third process gas, i.e., the third step T23 includes a pre-flow period T23*f* of solely supplying the second process gas. Further, during a following period T23*b* of supplying the third process gas in the third step T23, the RF power supply 76 is set in the ON state to turn the third process gas into plasma by the gas exciting section 66, so as to supply the third process gas in an activated state to the process field 5. The fourth step T24 is arranged to stop supply of the first, second, and third process gases to the process field 5.

The third embodiment exhibits the same operation and effect as those of the first embodiment. Further, since the steps T5 and T6 of the first embodiment are omitted, the throughput can be improved by that much. The process conditions of the third embodiment, such as gas flow rates, process pressures, and process temperatures, may be set basically the same as those of the first embodiment.

<Modification 1 of Third Embodiment>

Figure 11:
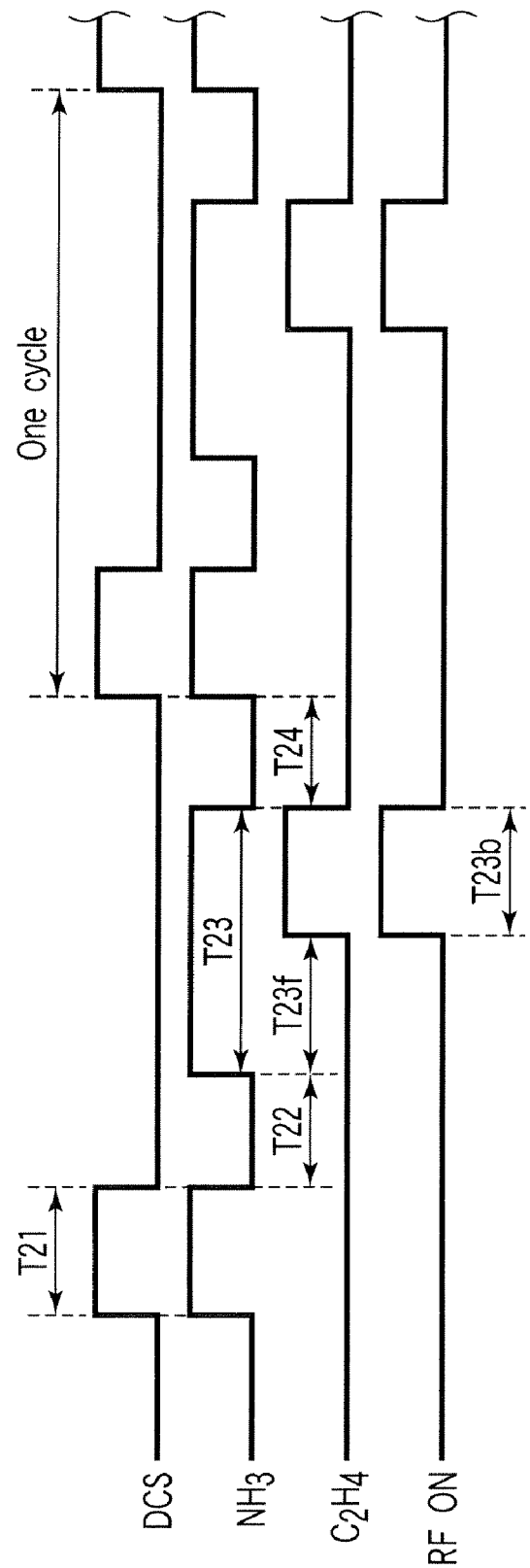
FIG. 11 is a timing chart of the gas supply and RF (radio frequency) application of a film formation method according to a modification 1 of the third embodiment of the present invention.

FIG. 11 is a timing chart of the gas supply and RF (radio frequency) application of a film formation method according to a modification 1 of the third embodiment of the present invention. As shown in FIG. 11, the modification 1 of the third embodiment is the same as the third embodiment except that the first step T21 is arranged to perform supply of the second process gas containing $NH_3$ gas in addition to the first process gas containing DCS gas.

The modification 1 of the third embodiment exhibits the same operation and effect as those of the third embodiment. Further, since the first step T21 is arranged to supply DCS and $NH_3$ together, this provides an additional advantage as described in the modification 1 of the first embodiment. The process conditions of this modification, such as gas flow rates, process pressures, and process temperatures, may be set basically the same as those of the third embodiment. However, it is preferable to adjust the conditions as described in the modification 1 of the first embodiment.

<Modification 2 of Third Embodiment>

Figure 12:
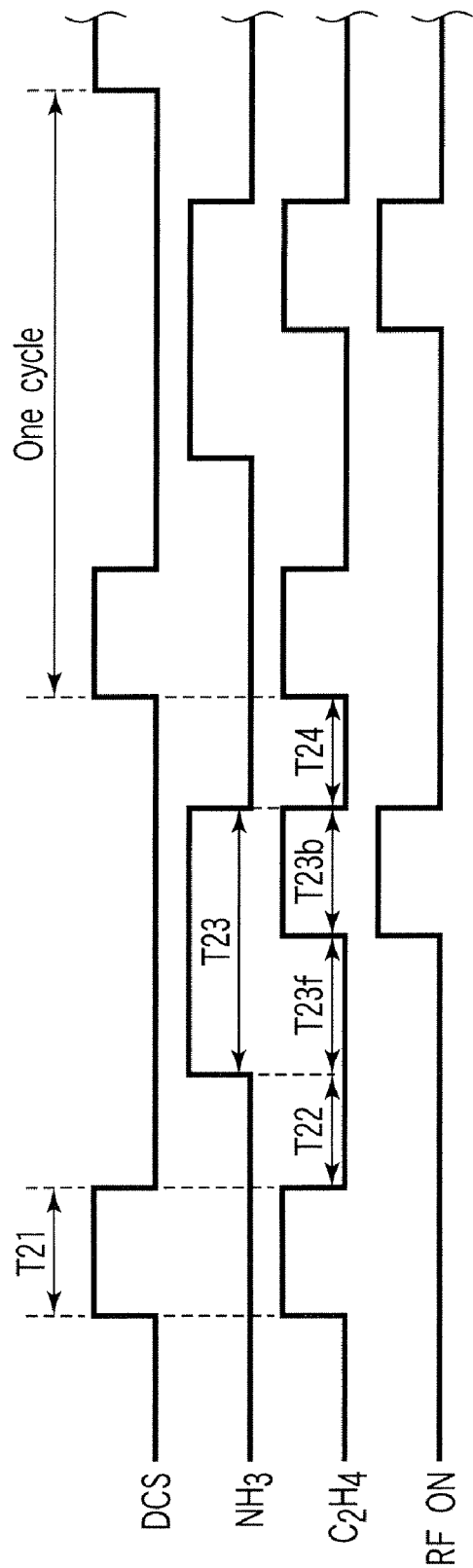
FIG. 12 is a timing chart of the gas supply and RF (radio frequency) application of a film formation method according to a modification 2 of the third embodiment of the present invention.

FIG. 12 is a timing chart of the gas supply and RF (radio frequency) application of a film formation method according to a modification 2 of the third embodiment of the present invention. As shown in FIG. 12, the modification 2 of the third embodiment is the same as the third embodiment except that the first step T21 is arranged to perform supply of the third process gas containing $C_2H_4$ gas in addition to the first process gas containing DCS gas.

The modification 2 of the third embodiment exhibits the same operation and effect as those of the third embodiment. Further, since the first step T21 is arranged to supply DCS and $C_2H_4$ together, this provides an additional advantage as described in the modification 2 of the first embodiment. The process conditions of this modification, such as gas flow rates, process pressures, and process temperatures, may be set basically the same as those of the third embodiment.

<Modification 3 of Third Embodiment>

Figure 13:
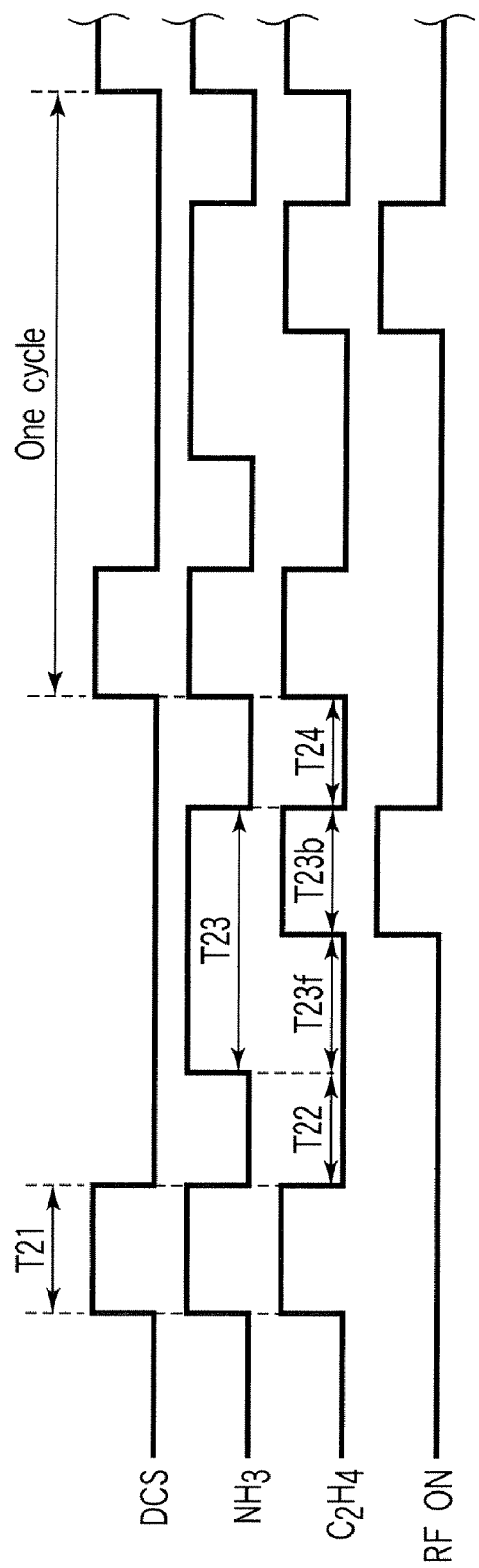
FIG. 13 is a timing chart of the gas supply and RF (radio frequency) application of a film formation method according to a modification 3 of the third embodiment of the present invention.

FIG. 13 is a timing chart of the gas supply and RF (radio frequency) application of a film formation method according to a modification 3 of the third embodiment of the present invention. As shown in FIG. 13, the modification 3 of the third embodiment is the same as the third embodiment except that the first step T21 is arranged to perform supply of the second process gas containing $NH_3$ gas and the third process gas containing $C_2H_4$ gas in addition to the first process gas containing DCS gas.

The modification 3 of the third embodiment exhibits the same operation and effect as those of the third embodiment. Further, the modification 3 of the third embodiment is expected to provide a synergistic effect of the modification 1 and modification 2 of the third embodiment. The process conditions of this modification, such as gas flow rates, process pressures, and process temperatures, may be set basically the same as those of the third embodiment. However, it is preferable to adjust the conditions as described in the modification 1 of the first embodiment.

Fourth Embodiment

Figure 14:
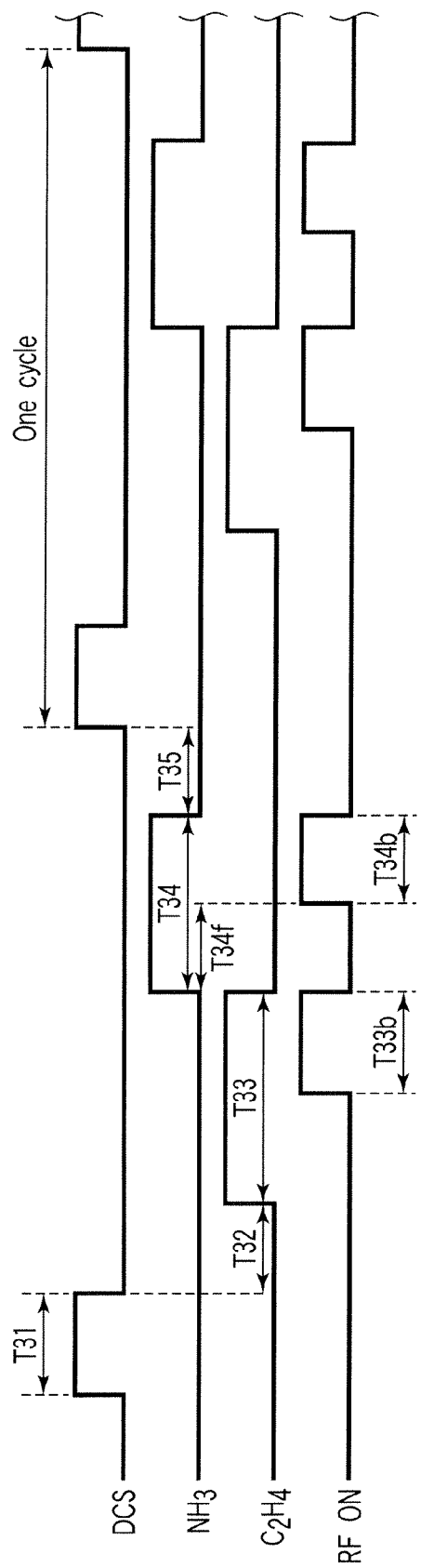
FIG. 14 is a timing chart of the gas supply and RF (radio frequency) application of a film formation method according to a fourth embodiment of the present invention.

FIG. 14 is a timing chart of the gas supply and RF (radio frequency) application of a film formation method according to the fourth embodiment of the present invention. As shown in FIG. 14, the film formation method according to this embodiment is arranged to alternately repeat first to fifth steps T31 to T35. A cycle comprising the first to fifth steps T31 to T35 is repeated a number of times, and thin films (unit layers) of SiCN formed by respective cycles are laminated, thereby arriving at an SiCN film having a target thickness. The fourth embodiment utilizes the structure shown in FIG. 3 to turn the second process gas into plasma by the gas exciting section 66, so as to supply $NH_3$ gas in an activated state to the process field 5.

Specifically, the first step T31 is arranged to perform supply of the first process gas (denoted as DCS in FIG. 14) to the process field 5, while stopping supply of the second process gas (denoted as $NH_3$ in FIG. 14) and the third process gas (denoted as $C_2H_4$ in FIG. 14) to the process field 5. The second step T32 is arranged to stop supply of the first, second, and third process gases to the process field 5. The third step T33 is arranged to perform supply of the third process gas to the process field 5, while stopping supply of the first and second process gases to the process field 5. Further, halfway through the third step T33, the RF power supply 76 is set in the ON state to turn the third process gas into plasma by the gas exciting section 66, so as to supply the third process gas in an activated state to the process field 5 during a sub-step T33b. The fourth step T34 is arranged to perform supply of the second process gas to the process field 5, while stopping supply of the first and third process gases to the process field 5. Further, halfway through the fourth step T34, the RF power supply 76 is set in the ON state to turn the second process gas into plasma by the gas exciting section 66, so as to supply the second process gas in an activated state to the process field 5 during a sub-step T34b. The fifth step T35 is arranged to stop supply of the first, second, and third process gases to the process field 5.

In other words, the fourth embodiment corresponds to a form that is arranged to replace the fourth step (purge step) T4 of the first embodiment (see FIG. 4) with a pre-flow period T34f of solely supplying the second process gas. Further, in the sub-step T34b following the pre-flow period T34f, the second process gas is turned into plasma by the gas exciting section 66 to supply $NH_3$ gas in an activated state to the process field 5. Since the $NH_3$ gas is activated, the nitridation process of an SiCN film can be performed more completely in a shorter time. The process conditions of the fourth embodiment, such as gas flow rates, process pressures, and process temperatures, may be set basically the same as those of the first embodiment.

<Modification 1 of Fourth Embodiment>

Figure 15:
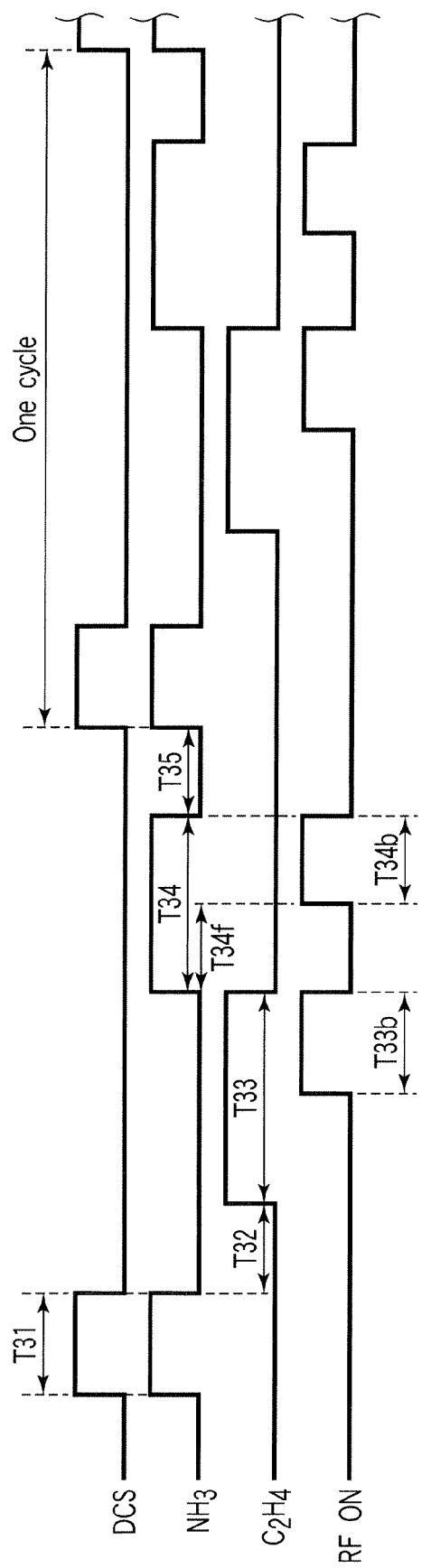
FIG. 15 is a timing chart of the gas supply and RF (radio frequency) application of a film formation method according to a modification 1 of the fourth embodiment of the present invention.

FIG. 15 is a timing chart of the gas supply and RF (radio frequency) application of a film formation method according to a modification 1 of the fourth embodiment of the present invention. As shown in FIG. 15, the modification 1 of the fourth embodiment is the same as the fourth embodiment except that the first step T31 is arranged to perform supply of the second process gas containing $NH_3$ gas in addition to the first process gas containing DCS gas.

The modification 1 of the fourth embodiment exhibits the same operation and effect as those of the fourth embodiment. Further, since the first step T31 is arranged to supply DCS and $NH_3$ together, this provides an additional advantage as described in the modification 1 of the first embodiment. The process conditions of this modification, such as gas flow rates, process pressures, and process temperatures, may be set basically the same as those of the fourth embodiment. However, it is preferable to adjust the conditions as described in the modification 1 of the first embodiment.

<Modification 2 of Fourth Embodiment>

Figure 16:
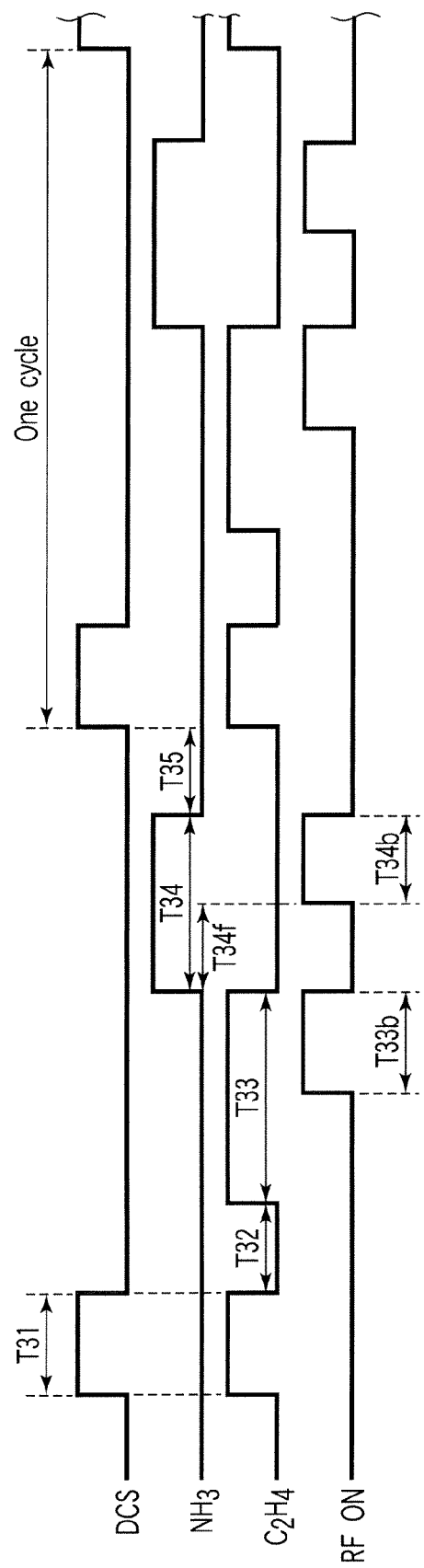
FIG. 16 is a timing chart of the gas supply and RF (radio frequency) application of a film formation method according to a modification 2 of the fourth embodiment of the present invention.

FIG. 16 is a timing chart of the gas supply and RF (radio frequency) application of a film formation method according to a modification 2 of the fourth embodiment of the present invention. As shown in FIG. 16, the modification 2 of the fourth embodiment is the same as the fourth embodiment except that the first step T31 is arranged to perform supply of the third process gas containing $C_2H_4$ gas in addition to the first process gas containing DCS gas.

The modification 2 of the fourth embodiment exhibits the same operation and effect as those of the fourth embodiment. Further, since the first step T31 is arranged to supply DCS and $C_2H_4$ together, this provides an additional advantage as described in the modification 2 of the first embodiment. The process conditions of this modification, such as gas flow rates, process pressures, and process temperatures, may be set basically the same as those of the fourth embodiment.

<Modification 3 of Fourth Embodiment>

Figure 17:
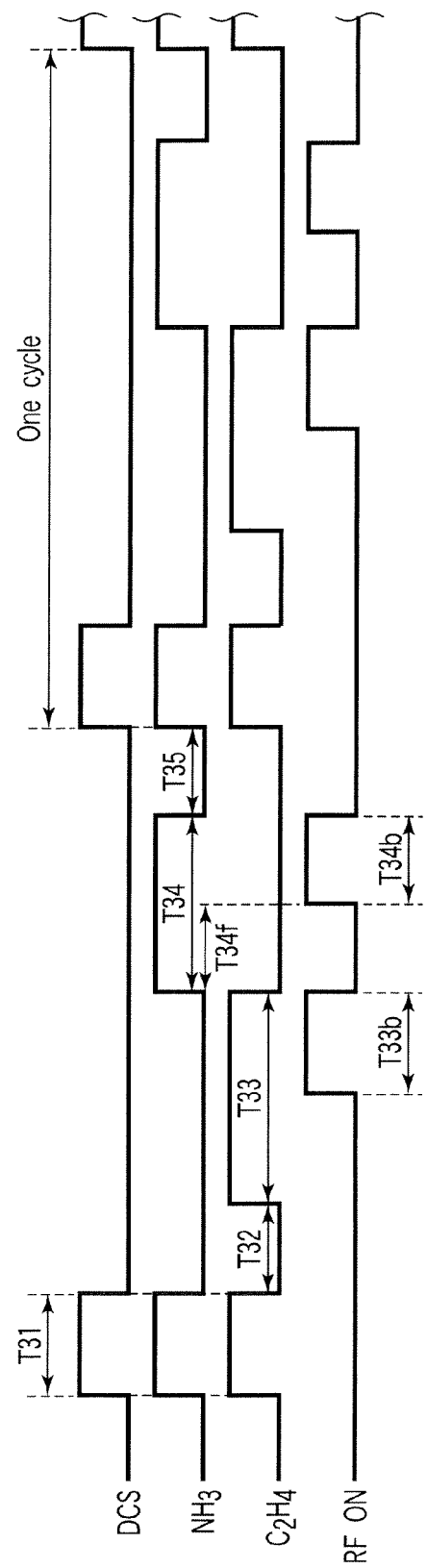
FIG. 17 is a timing chart of the gas supply and RF (radio frequency) application of a film formation method according to a modification 3 of the fourth embodiment of the present invention.

FIG. 17 is a timing chart of the gas supply and RF (radio frequency) application of a film formation method according to a modification 3 of the fourth embodiment of the present invention. As shown in FIG. 17, the modification 3 of the fourth embodiment is the same as the fourth embodiment except that the first step T31 is arranged to perform supply of the second process gas containing $NH_3$ gas and the third process gas containing $C_2H_4$ gas in addition to the first process gas containing DCS gas.

The modification 3 of the fourth embodiment exhibits the same operation and effect as those of the fourth embodiment. Further, the modification 3 of the fourth embodiment is expected to provide a synergistic effect of the modification 1 and modification 2 of the fourth embodiment. The process conditions of this modification, such as gas flow rates, process pressures, and process temperatures, may be set basically the same as those of the fourth embodiment. However, it is preferable to adjust the conditions as described in the modification 1 of the first embodiment.

<Experiment 1>

Figure 18:
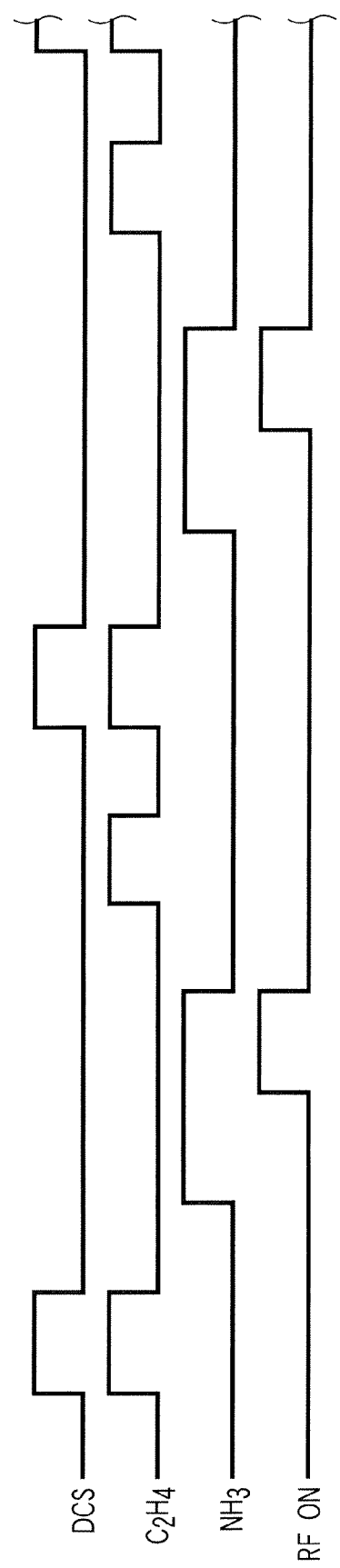
FIG. 18 is a timing chart of the gas supply and RF (radio frequency) application of a film formation method according to a comparative example.

Using the apparatus shown in FIG. 1, an insulating film was formed in accordance with each of the film formation methods according to some of the embodiments (including the modification) of the present invention, and then the film thus formed was examined. Further, as a comparative example CE, an insulating film was formed in accordance with a film formation method (disclosed in US 2006/0205231 A1) that was arranged not to turn the third process gas containing $C_2H_4$ gas into plasma but to turn the second process gas containing $NH_3$ gas into plasma, and then the film thus formed was examined. FIG. 18 is a timing chart of the gas supply and RF (radio frequency) application of a film formation method according to this comparative example CE.

Used as present examples of the present invention were a present example PE1-1 according to the modification 1 of the first embodiment shown in FIG. 5, a present example PE1-2 according to the modification 2 of the first embodiment shown in FIG. 6, a present example PE3-3 according to the modification 3 of the third embodiment shown in FIG. 13, and a present example PE4-2 according to the modification 2 of the fourth embodiment shown in FIG. 16. The process conditions of these four present examples were set as described with reference to the first to fourth embodiments. The process conditions of the comparative example CE were set the same as those of the four present examples of the present invention except for the gas supply timing.

Figure 19A:
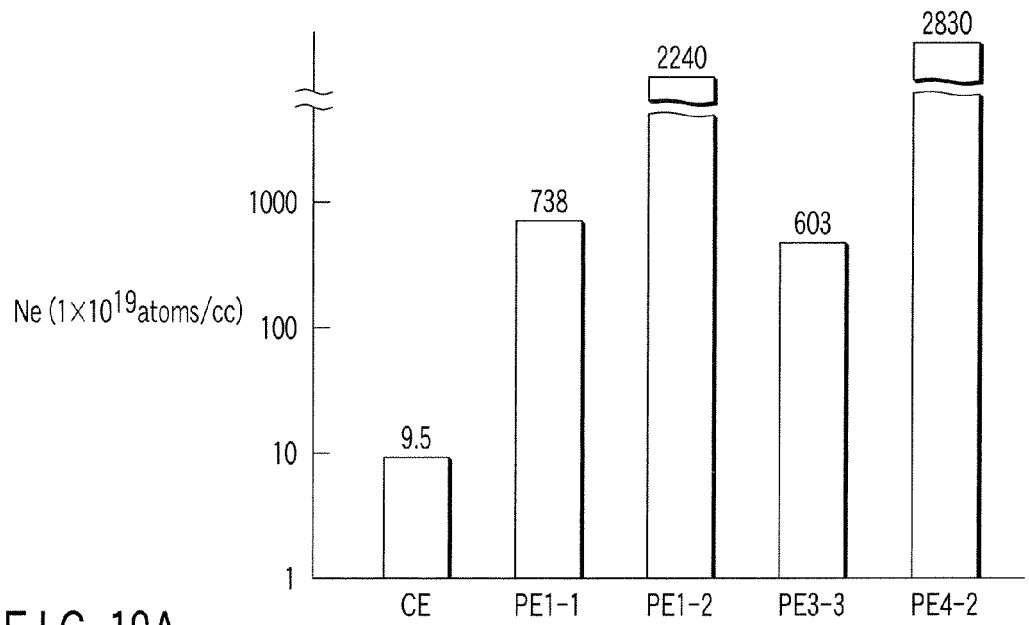
FIG. 19A is a graph showing experimental results concerning the carbon content Nc ($1 \times 10^{19}$ atoms/cc) of an SiCN film according to a comparative example CE and present examples PE1-1, PE1-2, PE3-3, and PE4-2.

FIG. 19A is a graph showing experimental results concerning the carbon content Nc ($1\times10^{19}$ atoms/cc) of an SiCN film according to the comparative example CE and present examples PE1-1, PE1-2, PE3-3, and PE4-2. As shown in FIG. 19A, the comparative example CE rendered a relatively low value of $9.5\times10^{19}$ atoms/cc in terms of the carbon content Nc of an SiCN film. On the other hand, the present examples PE1-1, PE1-2, PE3-3, and PE4-2 rendered far higher values of $738\times10^{19}$ atoms/cc, $2,240\times10^{19}$ atoms/cc, $603\times10^{19}$ atoms/cc, and $2,830\times10^{19}$ atoms/cc, respectively, in terms of the carbon content Nc of an SiCN film. It has been thus confirmed that the methods according to the embodiments of the present invention can greatly improve the carbon content of an SiCN film.

Figure 19B:
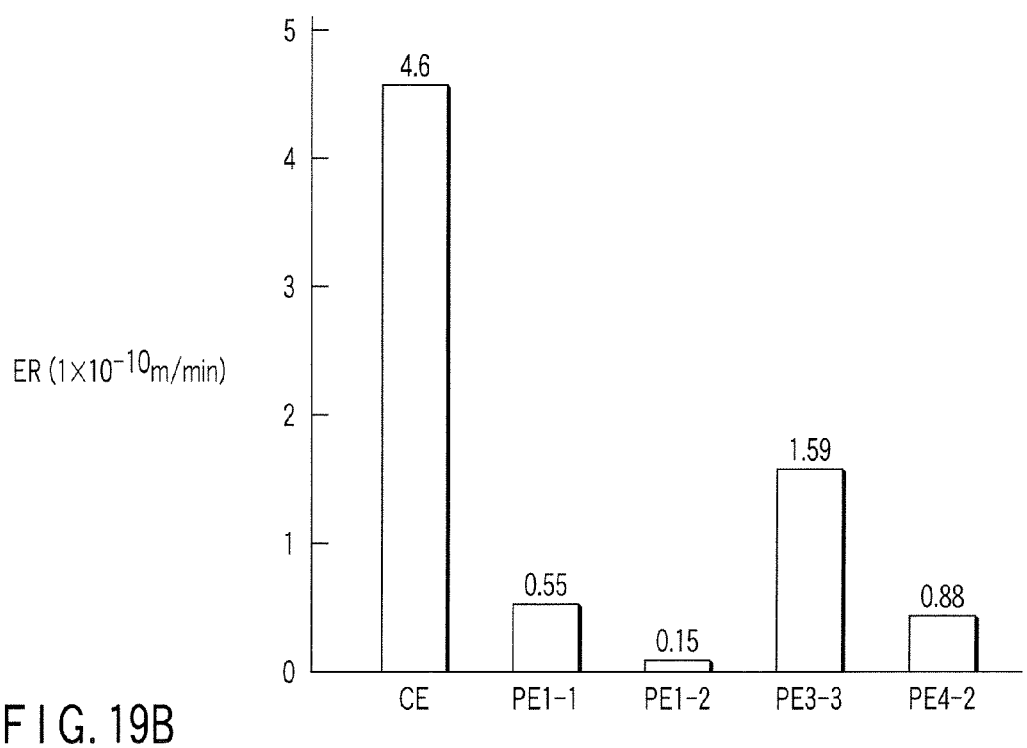
FIG. 19B is a graph showing experimental results concerning the DHF (diluted hydrofluoric acid) etching rate ER ($1 \times 10^{-10}$ m/min) of SiCN films according to the comparative example CE and present examples PE1-1, PE1-2, PE3-3, and PE4-2.

FIG. 19B is a graph showing experimental results concerning the DHF (diluted hydrofluoric acid) etching rate ER ($1\times10^{-10}$ m/min) of SiCN films according to the comparative example CE and present examples PE1-1, PE1-2, PE3-3, and PE4-2. As shown in FIG. 19B, the comparative example CE rendered a relatively high value of $4.6\times10^{-10}$ m/min in terms of the etching rate ER of an SiCN film. On the other hand, the present examples PE1-1, PE1-2, PE3-3, and PE4-2 rendered far lower values of $0.55\times10^{-10}$ m/min, $0.15\times10^{-10}$ m/min, $1.59\times10^{-10}$ m/min, and $0.88\times10^{-10}$ m/min, respectively, in terms of the etching rate ER of an SiCN film. It has been thus confirmed that the methods according to the embodiments of the present invention can greatly decrease the DHF etching rate of an SiCN film.

<Common Matters to First to Fourth Embodiments>

Figure 20:
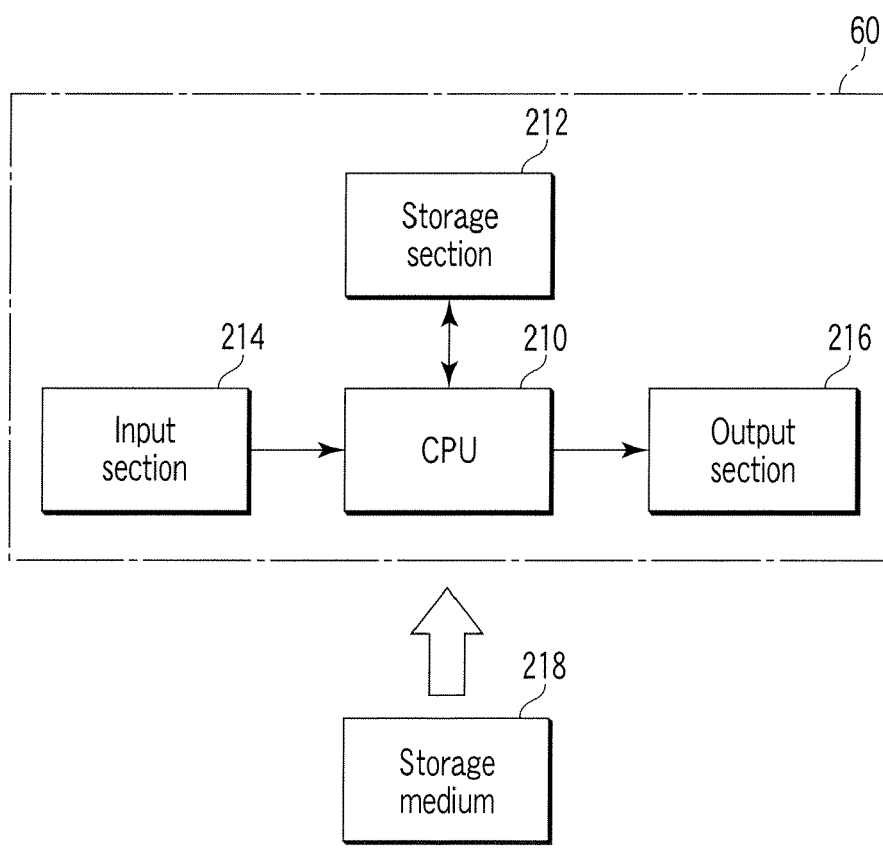
FIG. 20 is a block diagram schematically showing the structure of a main control section.

Each of the methods according to the first to fourth embodiments is performed under the control of the main control section 60 in accordance with a process program, as described above. FIG. 20 is a block diagram schematically showing the structure of the main control section 60. The main control section 60 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 20 also shows a storage medium 218 attached to the computer in a removable state.

Each of the methods according to the first to fourth embodiments may be written, as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the embodiments described above, for example, the first process gas contains DCS gas as a silane family gas. In this respect, the silane family gas may be one or more gases selected from the group consisting of dichlorosilane (DCS), hexachlorodisilane (HCD), monosilane (SiH$_4$), disilane (Si$_2$Cl$_6$), hexamethyl-disilazane (HMDS), tetrachlorosilane (TCS), disilylamine (DSA), trisilylamine (TSA), bistertial-butylaminosilane (BTBAS). In the embodiments described above, the second process gas contains NH$_3$ gas as a nitriding gas. In this respect, the nitriding gas may be N$_2$ gas. In the embodiments described above, the third process gas contains ethylene gas as a carbon hydride gas. In this respect, the carbon hydride gas may be one or more gases selected from the group consisting of acetylene, ethylene, methane, ethane, propane, and butane. Further, the target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming an insulating film on a target substrate by CVD, in a process field configured to be selectively supplied with a first process gas containing a silane family gas, a second process gas containing a nitriding gas, and a third process gas containing a carbon hydride gas, the method comprising repeatedly and alternately performing:
   a first step of performing supply of the first process gas to the process field;
   a second step of stopping supply of the first, second, and third process gases to the process field;
   a third step of performing supply of the third process gas to the process field while stopping supply of the first and second process gases to the process field, the third step comprising an excitation period of supplying the third process gas to the process filed while exciting the third process gas by an exciting mechanism;
   a fourth step of performing supply of the second process gas to the process field while stopping supply of the first and third process gases to the process field, the fourth step comprising an activation period of supplying the second process gas to the process field while exciting the second process gas by an activating mechanism; and
   a fifth step of stopping supply of the first, second, and third process gases to the process field.

2. The method according to claim 1, wherein the fourth step further comprises a period of supplying the second process gas to the process field while not exciting the second process gas by the activating mechanism, before the activation period.

3. The method according to claim 1, wherein the first step is arranged to perform supply of the first process gas to the process field while stopping supply of the second and third process gases to the process field.

4. The method according to claim 1, wherein the first step is arranged to perform supply of the first and second process gases to the process field while stopping supply of the third process gas to the process field.

5. The method according to claim 1, wherein the first step is arranged to perform supply of the first and third process gases to the process field while stopping supply of the second process gas to the process field.

6. The method according to claim 1, wherein the first step is arranged to perform supply of the first, second, and third process gases to the process field.

7. The method according to claim 1, wherein each of the second and fifth steps comprises a period of supplying a purge gas to the process field.

8. The method according to claim 1, wherein gas inside the process field is kept exhausted from the first step to the fifth step.

9. The method according to claim 1, wherein the third step further comprises a period of supplying the third process gas to the process field while not exciting the third process gas by the exciting mechanism, before the excitation period.

10. The method according to claim 1, wherein the first process gas contains at least one gas selected from a group consisting of dichlorosilane, hexachlorodisilane, monosilane, disilane, hexamethyldisilazane, tetrachlorosilane, disilylamine, trisilylamine, and bistertialbutylaminosilane, the second process gas contains at least one gas selected from a group consisting of ammonia and nitrogen, and the third process gas contains at least one gas selected from a group consisting of acetylene, ethylene, methane, ethane, propane, and butane.

* * * * *